United States Patent [19]

Tokumaru et al.

[11] 4,119,998
[45] Oct. 10, 1978

[54] INTEGRATED INJECTION LOGIC WITH BOTH GRID AND INTERNAL DOUBLE-DIFFUSED INJECTORS

[75] Inventors: Yukuya Tokumaru; Masanori Nakai; Satoshi Shinozaki; Junichi Nakamura; Shintaro Ito; Yoshio Nishi, all of Yokohama, Japan

[73] Assignee: Tokyo Shibaura Electric Co., Ltd., Tokyo, Japan

[21] Appl. No.: 815,768

[22] Filed: Jul. 14, 1977

Related U.S. Application Data

[63] Continuation of Ser. No. 644,292, Dec. 24, 1975, abandoned.

[30] Foreign Application Priority Data

Dec. 27, 1974 [JP] Japan ............................... 49-148562
Dec. 27, 1974 [JP] Japan ............................... 49-148563

[51] Int. Cl.$^2$ ............................................. H01L 27/04
[52] U.S. Cl. ...................................... 357/44; 357/46; 357/50
[58] Field of Search ............................ 357/44, 46, 92

[56] References Cited

U.S. PATENT DOCUMENTS

| 3,823,353 | 7/1974 | Berger et al. | 357/46 |
| 3,922,565 | 11/1975 | Berger et al. | 357/46 |
| 3,947,865 | 3/1976 | Russell | 357/56 |
| 3,982,266 | 9/1976 | Matzen et al. | 357/92 |
| 4,056,810 | 11/1977 | Hart et al. | 357/92 |

FOREIGN PATENT DOCUMENTS 2,512,737 10/1975 Fed. Rep. of Germany ............ 357/92

*Primary Examiner*—William D. Larkins
*Attorney, Agent, or Firm*—Finnegan, Henderson, Farabow & Garrett

[57] ABSTRACT

An integrated injection logic semiconductor device is composed of an N type semiconductor substrate, a P type layer, a first N type region so formed as to penetrate through the P type semiconductor layer and contact the N type semiconductor substrate, a second N type region formed in the P type semiconductor layer, and a P type region formed in the first N type region. A third N type region is provided surrounding said first and second N type regions and penetrating through the P type semiconductor layer. I$^2$L circuit is composed of a lateral PNP transistor whose emitter, base and collector are constituted by said P type region, said first N type region and said P type semiconductor layer, respectively, and a vertical NPN transistor whose emitter, base and collector are constituted by said N type semiconductor substrate, said P type semiconductor layer and said second N type region, respectively.

2 Claims, 7 Drawing Figures

INTEGRATED INJECTION LOGIC WITH BOTH GRID AND INTERNAL DOUBLE-DIFFUSED INJECTORS

This is a continuation of application Ser. No. 644,292, filed Dec. 24, 1975, now abandoned.

BACKGROUND OF THE INVENTION

This invention relates to an integrated injection logic semiconductor device.

Recently, much attention has been paid to the integrated injection logic (I²L) semiconductor device, simpler in construction, higher in manufacturing yeild and larger in integrated degree than a transistor-transistor logic semiconductor device. The I²L device is called also "MTL" (merged transistor logic) semiconductor device. This I²L semiconductor device is constructed such that a switching transistor and an injector for injecting minority carriers into the base region of the switching transistor are provided for the semiconductor substrate; and while the minority carriers are being injected into the base region of the switching transistor, the input of an I²L device is controlled so as to effectively control the output thereof, i.e., the output appearing at the collector of a switching transistor.

In a conventional I²L semiconductor device, an N type semiconductor layer is formed on the semiconductor by vapor epitaxial growth and on said N type semiconductor layer first and second P type regions formed by selectively diffusing boron into said N type semiconductor layer at a rate of about $10^{17}$ to $10^{19}$ atoms/cm$^3$ are provided. Phosphorus is diffused into said first P type region at a rate of about $10^{19}$ to $10^{21}$ atoms/cm$^3$ to form an N type region.

In the I²L semiconductor device having the foregoing construction, a lateral PNP transistor is constituted by said second P type region (emitter), said N type semiconductor layer (base) and said first P type region (collector) while a vertical NPN transistor is constituted by said N conductivity type semiconductor layer (emitter), and first P type region (base) and said N type region (collector).

In the I²L semiconductor device, since, as above described, said N type semiconductor layer region widened fanwise in a depth direction between said first and second P type regions is utilized as the base of the lateral transistor, the transport efficiency of the carriers supplied from the injector (the emitter of the lateral transistor) is not good. Further, since the base region of the lateral PNP transistor is commonly used also as the emitter region of the vertical NPN transistor, an improvement in the injection and transport efficiency of one transistor conversely causes a decrease in the injection and transistor efficiency of the other. As a result, the overall efficiency of the semiconductor device can not be increased to a greater extent than specified. Further, since said N type semiconductor layer constitutes the emitter of the vertical transistor, the impurity concentration of this N type semiconductor layer can not but be lower than that of said first P type region constituting the base layer of the vertical transistor. This is one of the causes of decreasing the injection and transport efficiency of the transistor.

SUMMARY OF THE INVENTION

The object of the invention is to provide an I²L semiconductor device whose lateral and vertical transistors are increased in respect of carrier-injection efficiency and carrier-transport efficiency.

Another object of the invention is to provide an I²L semiconductor device whose lateral and vertical transistors are increased in respect of current amplifying degree and decreased in respect of power delay product and power consumption.

According to the invention, there is provided an I²L semiconductor device which is composed of a semiconductor substrate of one conductivity type, a semiconductor layer of the opposite conductivity type to said one conductivity type laminated on the one conductivity type semiconductor substrate, a first one conductivity type region formed in the opposite conductivity type semiconductor layer and connected to said one conductivity type semiconductor substrate, a second one conductivity type region formed in said opposite conductivity type semiconductor layer, an opposite conductivity type region formed within said first one conductivity type region, and a separating region of said one conductivity type formed penetrating through said opposite conductivity type semiconductor layer and surrounding the first one conductivity type region and the second one conductivity type region. In the I²L semiconductor device having the foregoing structure, the emitter, base, and collector of the lateral transistor are constituted by the opposite conductivity type region, the first one conductivity type region, and the opposite conductivity type semiconductor layer, respectively, while the emitter, base and collector of the vertical transistor are constituted by the one conductivity type semiconductor substrate, the opposite conductivity type semiconductor layer and the second one conductivity type region, respectively.

DETAILED DESCRIPTION OF THE INVENTION

Figure 1:
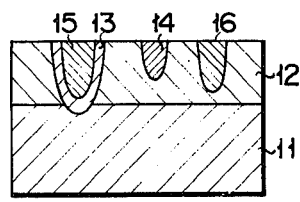
FIG. 1 is a sectional view showing the fundamental structure of an I²L semiconductor device according to the invention.

In FIG. 1, on a semiconductor substrate 11 of one conductivity type, for example, N conductivity type a semiconductor layer 12 of the opposite conductive type to said one conductive type, that is, P conductivity type is laminated by vapor epitaxial growth. This semiconductor layer 12 is epitaxially grown on the semiconductor substrate by using boron as a P or π conductivity type impurity, so as to permit said layer 12 to have a boron concentration of $10^{14}$ to $10^{16}$ atoms/cm$^3$ and a thickness of 2 to 3μm. First and second N conductivity type regions 13, 14 are formed in the P conductivity type semiconductor layer 12 by diffusion method. These first and second regions 13, 14 are formed by diffusing phosphorus as an N conductivity type impurity into said P conductivity type semiconductor layer at rates of $10^{16}$ to $10^{18}$ atoms/cm$^3$ and $10^{18}$ to $10^{20}$ atoms/cm$^3$ respectively. The first region 13 is formed penetrating through the P conductivity type semiconductor layer 12 to reach the N conductivity type semiconductor substrate 11. In contrast, the second region 14 is so formed as not to penetrate through the P conductivity type semiconductor layer 12.

The first N type region 13 and P type semiconductor layer 12 have formed therein first and second P$^+$ type regions 15 and 16 respectively. Both the first and second P$^+$ type regions 15 and 16 are formed by subjecting boron to thermal diffusion to a depth of 1 to 2μm in a high temperature-oxidizing atmosphere of 1050° C. The first P$^+$ type region 15, second N type region 14, and second P type region 16 have formed therein individually a pair of electrodes (not shown) by being subjected to aluminum-deposition.

In the semiconductor device having the foregoing structure, a lateral PNP transistor is formed whose emitter, base, and collector are constituted by the first P type region 15, first N type region 13, and P type semiconductor layer 12, respectively, and a vertical NPN transistor is formed whose emitter, base and collector are constituted by the N type semiconductor substrate 11, P type semiconductor layer 12 and second N type region 14, respectively.

Figure 2:
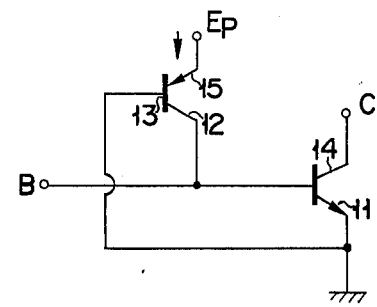
FIG. 2 is a diagram showing an equivalent circuit of the I²L semiconductor device shown in FIG. 1.

Of the above-mentioned lateral and vertical transistors, such an I$^2$L circuit as shown in FIG. 2 is formed. Note that said first P type region 15 acts as an injector while said second P type region constitutes an ohmic contact region.

Hereinafter, the operation of the I$^2$L circuit having the above-mentioned construction, i.e., of the I$^2$L semiconductor device is explained.

When, under the condition wherein the emitter of the vertical NPN transistor, i.e., the N type semiconductor substrate 11 is set at zero potential, a voltage $E_p$ having a level of +0.8 volt is applied to the emitter of the lateral PNP transistor acting as an injector, i.e., the first P type region 15. The positive holes injected from the injector region 15 into the base of the lateral transistor, i.e., the N type region 13 are passed through this base region 13 to reach the collector of the lateral transistor, i.e., the P type semiconductor layer 12. For this reason, the collector region 12 is charged with an excessive amount of positive holes and therefore electrons are injected into this collector 12. Since the P type semiconductor layer 12 acting as the collector of the lateral PNP transistor is commonly used also as the base of the vertical NPN transistor, injection of electrons into the collector region 12 causes the vertical NPN transistor to become operative, which causes its collector region 14 (terminal C in FIG. 2) to have zero potential. In this case, the base of the vertical NPN transistor is connected through the second P type region 16 to an input (terminal B in FIG. 2) of the I$^2$L circuit. The semiconductor layer 12 at a logical level of "1", that is to say, is brought to an opened condition, or is applied with an appropriate positive potential higher than the threshold potential of the emitter-grounded type NPN transistor. However, when this base, i.e., the semiconductor layer 12 is made to have zero potential, the vertical NPN transistor is brought to a cut-off condition, and as a result the collector of the vertical transistor connected to an output end C of the I$^2$L circuit, i.e., the collector region 14 has a positive potential. The I$^2$L circuit constitutes an inverter wherein when the input B of the I$^2$L circuit is "1" the output C thereof is "0", whereas then the input of the I$^2$L circuit is "0", the output thereof is "1".

Generally, in the IC technique, a plurality of I$^2$L circuits are incorporated on a single semiconductor substrate. Since, in this case, one side face of the base region 13 of a lateral transistor of one circuit element is connected to the collector region 12 of a lateral transistor of another circuit element the positive holes injected from the injector region 15 of the one circuit element into the base region 13 thereof are injected into the collector region 12 of said other circuit element through the one side face of the base region 13. That is to say, half of the positive holes are injected into the one circuit, and if this is viewed from the standpoint of the one circuit element, it results that the hole-injection efficiency of the one circuit element is decreased by the extent corresponding to the positive holes transferred into said other circuit element.

Figure 3A:
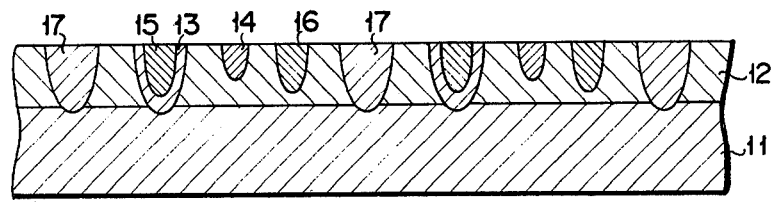
FIGS. 3A and 3B respectively are sectional and plan views of the I²L semiconductor device according to an embodiment of the invention.
Figure 3B:
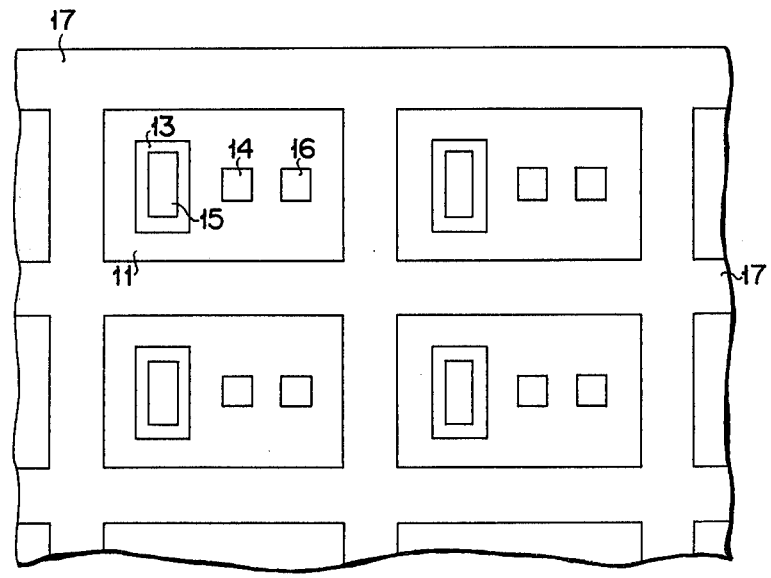

Under such circumstances, according to the invention, a third N type region, i.e., separating region 17 is formed in the P type semiconductor layer 12 in a manner penetrating through the layer 12 to reach the N type semiconductor substrate 11, so as to surround the first N type region 13, second N type region 14, and second P type region 16 as shown in FIGS. 3A and 3B. By providing the separating region 17 one I$^2$L circuit element is separated from another circuit element to prevent the injected holes from entering the collector region of a lateral transistor of said another circuit element. As a result, the hole injection efficiency of said one I$^2$L circuit element is improved.

Figure 4:
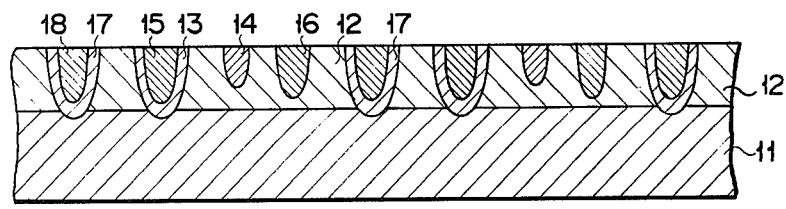
FIG. 4 is a sectional view of the I²L semiconductor device according to another embodiment of the invention, said device being prepared by further providing an injector region in the separating region of the device shown in FIG. 2.

In an embodiment shown in FIG. 4, a P type region 18 similar to the injector region 15 is formed in the separating region shown in FIGS. 3A and 3B. Note that a pair of electrodes (not shown) are provided for said P type region 18 by aluminum-deposition. By providing the P type region 18 also in the separating region 17 in the above-mentioned manner, the P type region 18 can be used as an additional injector, which results in an increase in the amount of holes injected into the I$^2$L circuit element, which results in an increase in the speed at which the I$^2$L circuit element operates. Where, as above described, the injector region 18 is provided in the separating region 17, this separating region 17 preferably is provided in advance as closely to the base region 13 of the lateral transistor as possible.

Figure 5:
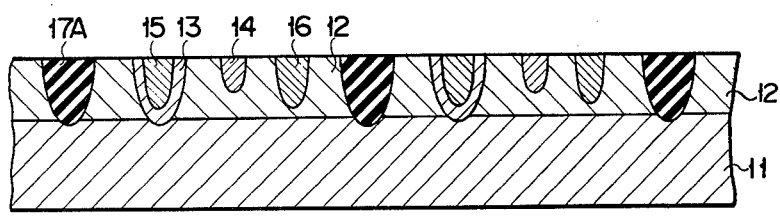
FIG. 5 is a sectional view of the I²L semiconductor device according to still another embodiment of the invention, wherein the separating region is formed of insulating material.

In an embodiment shown in FIG. 5, a separating region 17A is formed of insulating material layer. According to this separating region, the capacitance between the region 17A and the P type layer 12 is substantially zero, which results in an increase in the operating speed of the I$^2$L circuit element.

According to the I$^2$L semiconductor device having the above-mentioned structure, the base region 13 of the lateral PNP transistor is formed so as to surround the injector (emitter) region 15 in a manner spaced equidistantly from the region 15, and therefore the holes injected from the region 15 are introduced with high efficiency into the base region 13, so that the transport efficiency within the base region is also increased.

Figure 6:
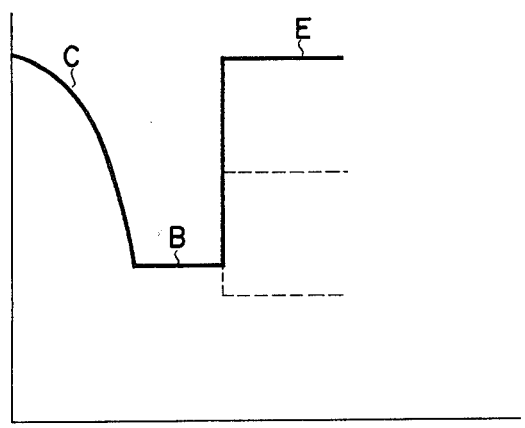
FIG. 6 is an impurity concentration profile of the vertical transistor of the I²L semiconductor device according to the invention.

As above described, according to the invention, the carrier injection efficiency and transport efficiency of minority carriers injected from the injector region of the lateral transistor are remarkably increased. Furthermore, since the base region 13 of the vertical transistor is so formed as to have an impurity concentration extremely lower than that of the emitter region 15 of the vertical transistor as seen from the concentration profile of FIG. 6 wherein lines C, B and E show collector, base and emitter regions, the injection efficiency of minority carriers from the emitter region to the base region and the transport efficiency of the minority carriers within the base region are improved strikingly.

Further, since, according to the invention, the impurity concentration of the P type semiconductor layer is lower than that of the N type semiconductor substrate, the switching speed of the I$^2$L circuit element can be high with no increase in the junction capacitance. Accordingly, the power delay product of the I$^2$L semiconductor device can be sufficiently suppressed, or made sufficiently small, and therefore this invention is very advantageous for formation into IC.

Further, since each I$^2$L circuit element is surrounded by the separating region 17, the holes injected from the injector region through the base region are prevented from being transferred into the collection region of a lateral transistor of another I$^2$L circuit element, thus increasing the power efficiency of each I$^2$L circuit element.

The foregoing embodiments referred to the case where the N conductivity type semiconductor material was used as the semiconductor substrate 11, but this substrate 11 may be formed of an opposite conductivity type, or a P conductivity type semiconductor material and other regions and layer may also be formed of material of the conductivity type inverted correspondingly.

What we claim is:

1. An integrated injection logic semiconductor device comprising a semiconductor substrate of one conductivity type, a layer of the opposite conductivity type to said one conductivity type laminated on said semiconductor substrate of one conductivity type, a first one conductivity type region formed penetrating through said opposite conductivity type layer to reach said one conductivity type semiconductor substrate, a second one conductivity type region formed in said opposite conductivity type layer, an opposite conductivity type region formed in said first one conductivity type region, a separating region formed of material of said one conductivity type and penetrating through said opposite conductivity type layer and surrounding said first and second one conductivity type regions, and an additional region of said opposite conductivity type formed in said separating region whereby said opposite conductivity type region, said first one conductivity type region and said opposite conductivity type layer constitute a lateral transistor of one polarity type; and said one conductivity type semiconductor substrate, said opposite conductivity type layer and said second one conductivity type region constitute a lateral transistor of the opposite polarity type.

2. An integrated injection logic semiconductor device comprising an N conductivity type semiconductor substrate, a P conductivity type semiconductor layer laminated on said N conductivity type semiconductor substrate, at least one first N conductivity type region formed penetrating through said P conductivity type semiconductor layer, a P conductivity type region formed in said first N conductivity type region, at least one second N conductivity type region formed in said P conductivity type semiconductor layer, a separating region formed of an N conductivity type material and penetrating through said P conductivity type semiconductor layer and surrounding said first and second N conductivity type regions and, an additional P conductivity type region formed in said separating region whereby said P conductivity type region, said first N conductivity type region and said P conductivity type semiconductor layer constitute a lateral PNP transistor; and said N conductivity type semiconductor substrate, said P conductivity type semiconductor layer and said second N conductivity type region constitute a vertical NPN transistor.

* * * * *